United States Patent [19]
Benzel

[11] Patent Number: 5,828,330
[45] Date of Patent: *Oct. 27, 1998

[54] ANALOG TO DIGITAL CONVERTER HAVING DYNAMICALLY CONTROLLED NON-LINEAR OUTPUT

[75] Inventor: Phillip J. Benzel, Fremont, Calif.

[73] Assignee: Exar Corporation, Fremont, Calif.

[*] Notice: The term of this patent shall not extend beyond the expiration date of Pat. No. 5,592,167.

[21] Appl. No.: 820,535

[22] Filed: Mar. 19, 1997

[51] Int. Cl.$^6$ .................................................. H03M 1/36
[52] U.S. Cl. ............................................. 341/159; 341/136
[58] Field of Search ..................................... 341/159, 157, 341/138, 155, 136

[56] References Cited

U.S. PATENT DOCUMENTS

| | | | |
|---|---|---|---|
| 4,839,653 | 6/1989 | Devito | 341/157 |
| 5,349,389 | 9/1994 | Keller | 348/625 |
| 5,592,167 | 1/1997 | Caruso et al. | 341/159 |

*Primary Examiner*—Brian K. Young
*Assistant Examiner*—Peguy JeanPierre
*Attorney, Agent, or Firm*—Townsend and Townsend and Crew LLP; Henry K. Woodward

[57] ABSTRACT

The output of an analog to digital converter is selectively controlled to provide a non-linear response by addition or removal of current from resistors in the ADC reference level resistor ladder so that voltage drops are reduced or increased across selected resistors. In one embodiment a current mirror is employed to remove current at selected nodes of the resistor ladder. Span current and current mirror current can be controlled so that span and the desired non-linearity will track when span is altered.

20 Claims, 5 Drawing Sheets

Detail A

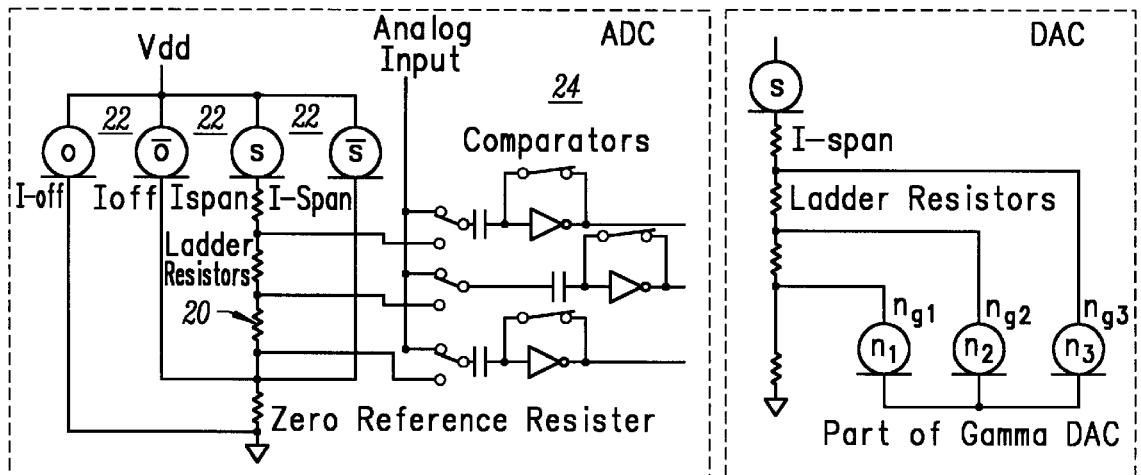
Detail A
FIG. 3A
Detail B
FIG. 3B
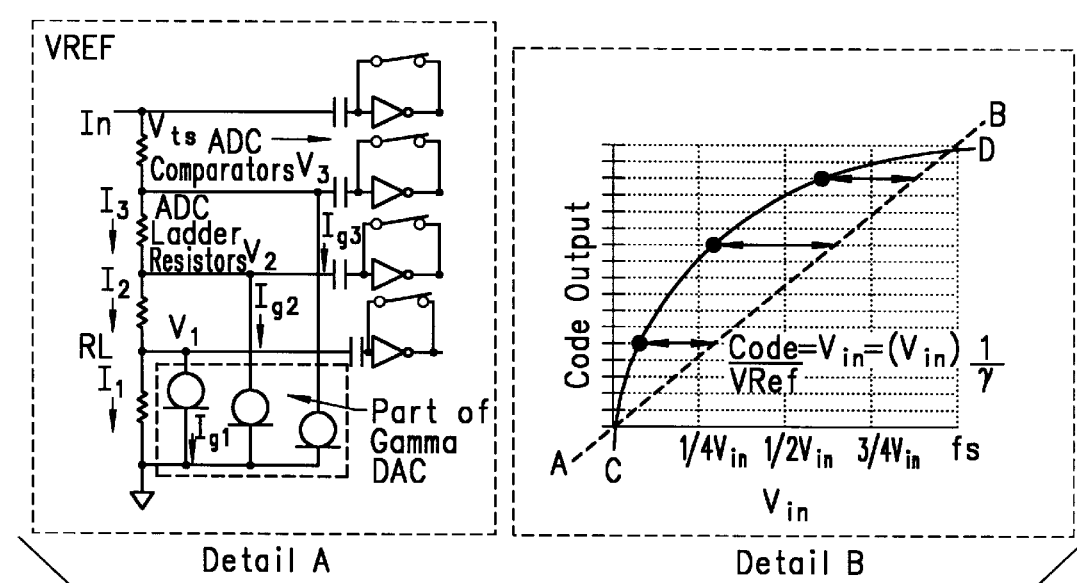
Detail A
Detail B
FIG. 3C

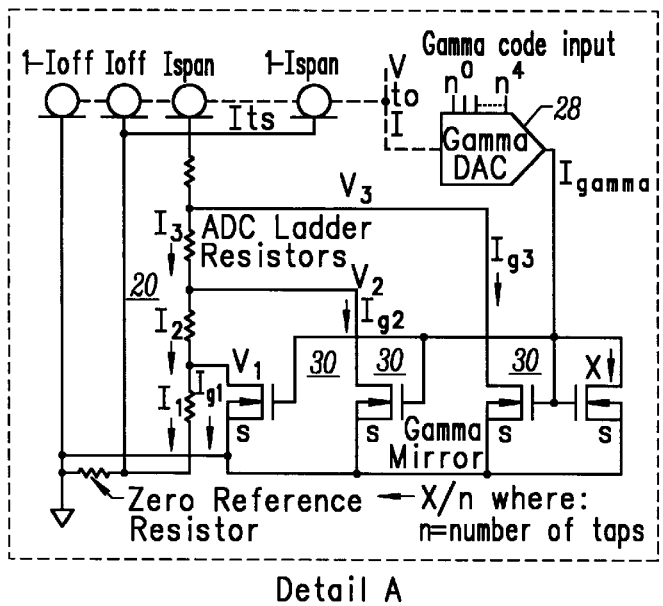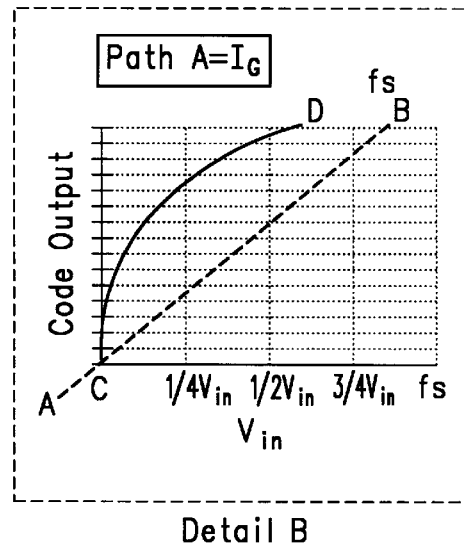
Detail A
FIG. 4A
Detail B
FIG. 4B
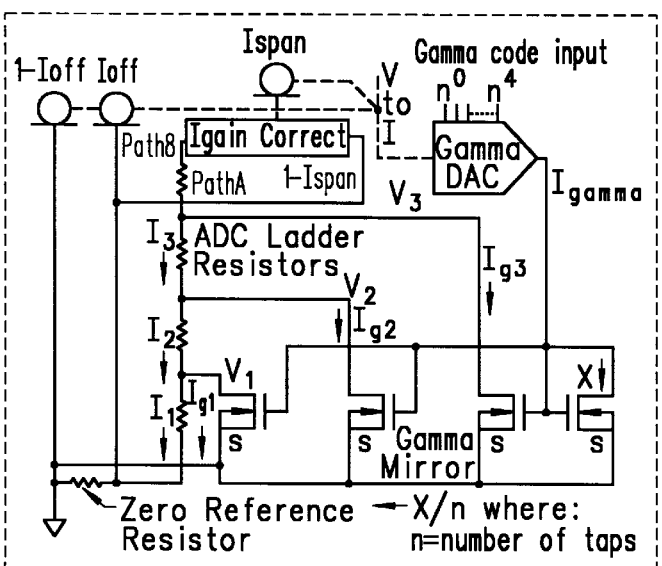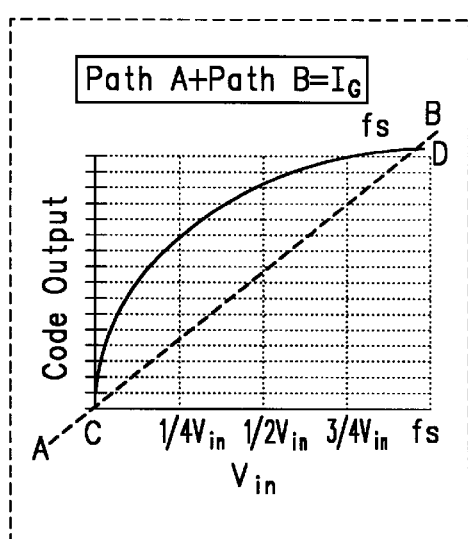
Detail A
FIG. 5A
Detail B
FIG. 5B

ANALOG TO DIGITAL CONVERTER HAVING DYNAMICALLY CONTROLLED NON-LINEAR OUTPUT

BACKGROUND OF THE INVENTION

This invention relates generally to analog to digital converters, and more particularly the invention relates to an analog to digital converter having a dynamically controllable non-linear analog to digital transfer function.

The analog to digital converter (ADC) converts analog signals to digital signals by comparing an analog input signal with various voltage levels provided by a resistor ladder network. While the analog input can have a linear relationship with the digital output, in some applications it is desirable to modify this relationship. In a digitizer for converting an analog video output from a charged coupled device (CCD), for example, it may be desirable to provide dark gray level enhancement. This is due to the non-linearity of the human visual system which is unable to differentiate various gray scale levels equally. More particularly, the human visual system can distinguish variations in the darker regions more readily than in the lighter regions. Thus, the relative visual response favors detail in the darker gray shaded areas. When dealing with a system that inputs or outputs gray scale information for human visual consumption, it may be desirable to include a transfer function that is more in line with a human visual model. While an obvious scheme would be to use enough resolution for the darker regions, this would be wasteful and may require a digitizer with more resolution than can be provided at a given costs. It would be preferable to provide some means to modify the transfer function of the digitizer to match that of the human visual model. The modified transfer function, referred to herein as gamma, represents the amount of change from a linear transfer function, as illustrated in FIG. 1. FIG. 1 represents an ADC transfer function for human visual response versus a gray scale for 16 levels of relative light intensity. The correction, or gamma, between the ideal (linear) transfer and the modified curve is indicated by the lines with arrows at both ends indicating the change from linear to nonlinear output versus input. It will be noted in FIG. 1 that at the darker gray scale more code output states are presented than at the lighter scales. Approximately three-fourths of the output states are contained in the first half of the input voltage, $V_{in}$. Approximately one-half of the output states cover the first one-fourth of $V_{in}$. A digitizing system for image capture will normally also contain means to correct for the minimum and maximum reference levels which correspond to for example a scene and camera minimum-dark and maximum-bright conditions.

Early schemes developed for minimum and maximum reference level correction were performed dynamically rendering real time video recording through software/hardware interaction using controlled voltage sources. Such solutions have been implemented using analog to digital converters that provide full scale and zero reference from two voltage DACs. However, this method requires operational amplifiers to drive the video ADC internal ladder elements, costing circuit surface area or real estate and adding power consumption. Further, the control of the zero and full scale references interact so that a change in the span also affects the reference voltage.

Early schemes developed for gray scale nonlinear transfer functions were performed by the use of linear to log or other function conversion before the input to the ADC, by a fixed nonlinear ladder for Analog to Digital Converter threshold reference level generation, or by using a higher resolution ADC and changing the output data to a reduced code set. Some solutions would use an ADC where the reference ladder taps are driven by voltage levels or connected to extra resistors resulting in the desired transfer function.

The present invention provides an improved ADC with a programmable gamma correction, as well as minimum and maximum reference level control that are maintained at constant levels independent of the Gamma Setting.

SUMMARY OF THE INVENTION

In accordance with a preferred embodiment of the invention, an analog to digital converter includes a code converter, a resistor ladder connected between a zero reference voltage level and a maximum span voltage level for use in comparing an analog voltage and driving said code converter, said resistor ladder comprising a plurality of serially connected resistors with nodes between resistors, a first current driver means for selectively steering part of a first current through said resistor ladder and establishing said span voltage, and current sink means connected to said nodes for selectively adding or removing current from selected resistors and thus increasing or reducing voltage drop across said selected resistors. A zero reference resistor can be serially connected with said resistor ladder, and a second current driver means is provided for selectively steering a part of a second current through said zero reference resistor for establishing a zero reference voltage for said span voltage. The current sink can comprise a current mirror having a plurality of N-channel enhancement mode transistors which receive a common bias voltage from a gamma digital to analog converter and driver which responds to a digital code for non-linearity control and for providing a gamma current to said current mirror.

The invention and objects and features thereof will be more readily apparent from the following description and appended claims when taken with the drawings.

BRIEF DESCRIPTION OF THE DRAWINGS

FIGS. 3A, 3B are schematics of an ADC and DAC in accordance with one embodiment of the invention; and FIG. 3C is a plot of a gamma corrected transfer curve for the ADC.

FIG. 4A is a schematic of a DAC in accordance with another embodiment of the invention; and FIG. 4B is a plot of the gamma corrected transfer curve for an ADC using the circuit of FIG. 4A.

FIG. 5A is a schematic of another embodiment of a DAC in accordance with the invention; and FIG. 5B is a plot illustrating the gamma corrected transfer curve for an ADC using the circuit of FIG. 5A.

DETAILED DESCRIPTION OF ILLUSTRATIVE EMBODIMENTS

Figure 1:
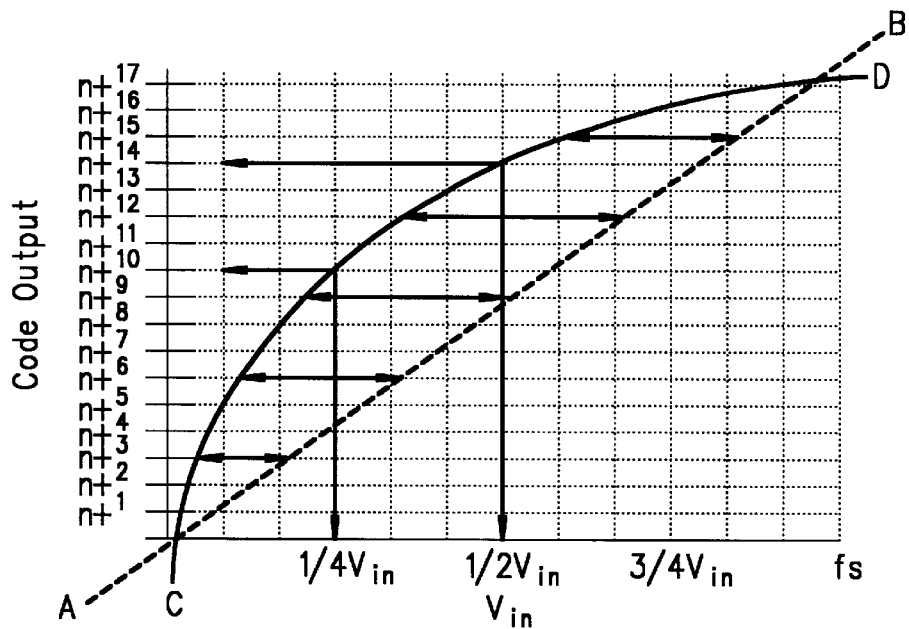
FIG. 1 is a graph illustrating a gamma corrected transfer curve.
Figure 2:
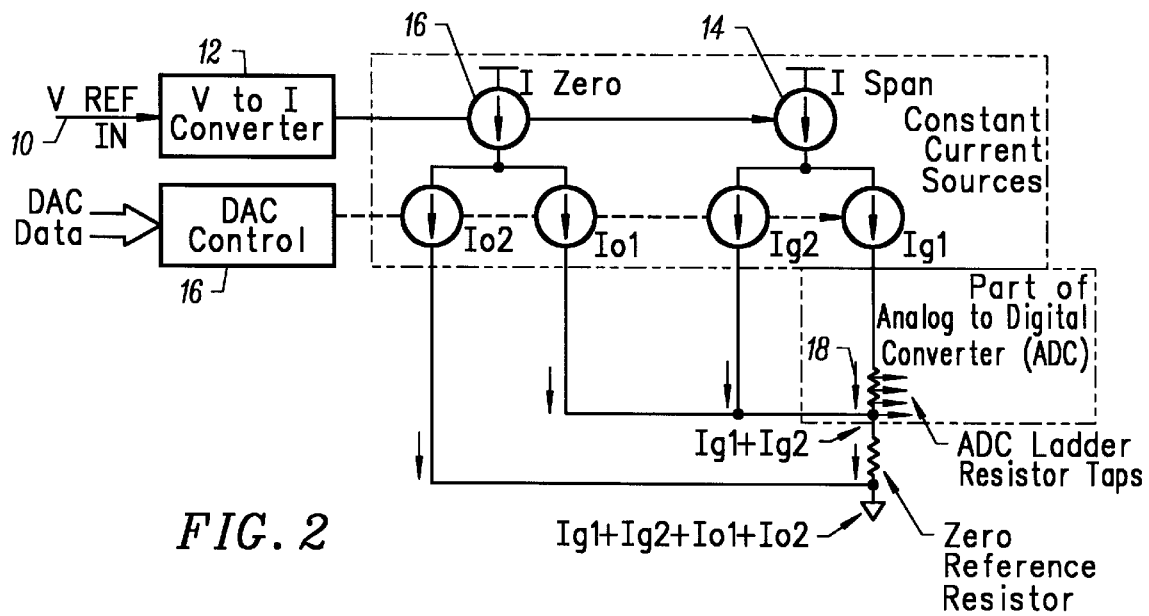
FIG. 2 is a schematic of a constant current controlled ADC resistor ladder with independent span and zero reference control.

Referring now to the drawings, FIG. 2 is a schematic of a constant current controlled resistor ladder of a DAC in accordance with co-pending applications U.S. Ser. No. 08/325,716 now U.S. Pat No. 5,592,167. An external reference voltage at 10 is converted to a current at 12 for controlling a constant span current (I-Span) 14 and a constant zero current (I-Zero) 16. The span constant current is steered through Ig1 and Ig2 current paths in accordance with the DAC control 16 which responds to control data supplied by the external user. Thus a portion of the span current passes through leg Ig1 and through the span resistor of the resistor ladder 18 for a 1 bit DAC. Another portion of the span current passes through the Ig2 leg and bypasses the span resistor of the resistor ladder 18. In a multiple bit DAC, several sets of Ig1/Ig2 path switches would be provided to make up a complete DAC of n bits resolution. The zero reference or offset section of resistor ladder 18 functions similarly to that described for the span section using the current paths Io1 and Io2. A key feature of this technique is the switching of current through the ladder resistors and zero reference resistor. Should there be a requirement to increase the full scale (fs) voltage at the top of the ladder, more current is switched into the ladder resistor. However, the sum of currents Ig1 and Ig2 remain constant through the zero reference resistor at the bottom of the ladder which produces a constant voltage drop regardless of the full scale voltage selected by the span DAC.

FIGS. 3A and 3B illustrate a DAC in accordance with one embodiment of the present invention, and FIG. 3C is a plot of the gamma corrected transfer curve therefor. In FIG. 3A a current controlled DAC similar to the DAC illustrated in FIG. 2 includes the resistor ladder 20 and the span and offset current sources 22, similar to the current sources of FIG. 2. The three nodes of the ladder resistors provide the outputs to comparators 24 along with the analog input. Assuming that the resistors in the ladder 20 are of equal value, the output of the circuitry of FIG. 3A would be linear. However, in accordance with the invention portions of the current at each of the nodes of the ladder resistors are bypassed as shown in FIG. 3B, thereby altering the current through the resistors and the resulting voltage drop across the resistors. This results in the gamma corrected transfer curve of FIG. 3C.

The gamma control concept closely follows the constant current DAC technique of FIG. 2. The major difference relates to how the implementation utilizes more N channel transistor devices to increase speed of operation. The gamma correction includes providing end user control for modification of the transfer function in accordance with the gamma corrected transfer curve of FIG. 3C. The tap points of the resistor ladder are represented by dots on the transfer curve, and by pulling current out of each ladder leg, each tap point moves to a lower $V_{in}$ voltage. By pulling equal current out of several gamma taps, the transfer function is distorted to provide for less voltage change per code output near the ladder bottom. This represents higher resolution (more code output) for legs having gamma taps near the bottom of the ladder and approximates the desired transfer curve.

FIG. 4A is a schematic of another embodiment of the invention and FIG. 4B is the gamma corrected transfer curve for the circuit. In this embodiment a gamma DAC 28 is incorporated in the circuit to control current mirror 30 in extracting current from the nodes of the resistor ladder 20. This ADC is useful in applications where it is desirable to deviate from a linear transfer, such as a CCD camera or a gray scale scanner. The circuitry provides a flexible means for the external user to dynamically adjust the linearity of the transfer function. This could include transfer matching for different devices multiplexed through a single common ADC. Alternatively, the transfer matching might also provide a single one-time adjustment for a particular device. In this case the gamma DAC would typically be downloaded with the transfer matching information timewise near power up. The capability can also be used in an interactive system where it would be desirable to control the gray scale resolution in real time. In this case a human operator would be in control of the man/machine interface implemented through the gamma control capability. Again, the basic linear transfer function is modified by shunting current away from the bottom resistor, $R_L$. The current mirror can be duplicated for connection across each of the ladder resistor taps. It should be noted that the number of input bits to the gamma DAC, and the number of ladder taps do not need to have a 1:1 ratio. The number of inputs to the gamma DAC determines fine accuracy for a given transfer deviation, while the number of ladder taps provides granularity (smoothness) and step function characteristics for the modified transfer curve.

In the circuitry of FIG. 4A, the reduction in current through the zero offset resistor (current pulled out by the gamma mirrors) will result in a shift in the offset toward zero volt. This is a result of the reduction of current through $R_L$. This can be offset in part by adding a path A to the circuitry of FIG. 4A, as illustrated in FIG. 5A. However, the full scale (fs) tracking points do not pass through each other. This is demonstrated in FIG. 3C where point B and point D do not have the same end points.

To keep the offset and fs points the same, the current removed by the gamma current mirror is reinserted in the ladder. This current needs to be added into the ladder at the proper place to maintain a constant current, while providing individual ladder resistor current adjustment. By inserting the current in the offset path (path A), a copy of the current removed by the gamma current mirror is reinserted at the top of the zero reference resistor. In this method, the current through the zero reference resistor is maintained constant. In order to maintain the full span, the current removed by the gamma mirror must also be reinserted at the top of the ladder. For example, if the gamma current mirror removes or bypasses 1% of the original current, then 1% of the current must be added at the top of the ladder. Thus the top of the ladder starts with 101% of the required current. The gamma mirror removes 1%. This leaves 100% of the current which means the current through the ladder remains unchanged. Unfortunately, this is not quite accurate since the addition of 1% at the top of the ladder and another 1% at the zero reference resistor results in a current of 102% rather than 101%. To overcome this, the I-Span current is split into path A and path B. The sum of path A and B currents through the zero reference resistor will be constant, thereby insuring a constant zero reference voltage. The ratio of current through path A versus path B can be adjusted such that the gamma curve fs end point falls on the linear fs end point. This is shown in FIG. 5B where point D and point B fall on top of each other at full scale (fs). With all the gamma mirror currents being equal, the path A and path B currents are split equally.

Figures 6A, 6B:
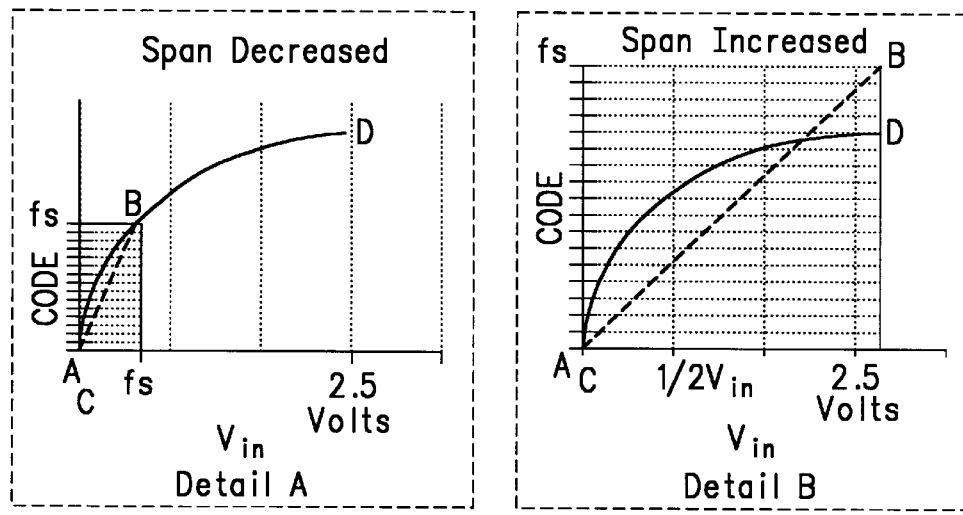
FIGS. 6A, 6B illustrate gamma corrected transfer curves without span correction.

The gamma DAC described above exhibits limitations when considering a changing full scale (gain) requirement. Full scale requirements are often called span (coverage or range) or gain. In the gamma DAC described above, a change in span would provide a corresponding change in the gamma curve. As such, a change in span would result in a loss of distribution of gamma points, or the lowering span would put more code transition points on the sharp increase portion of the curve. Increasing the span would simply add increased $A_{in}$ range where there are few code transition points. An example of this can be seen in FIGS. 6A and 6B. In FIG. 6A, the same output codes are forced into a smaller area of $V_{in}$. This area represents the lower, sharply increasing portion of the gamma curve. In the example of FIG. 6B, the same output codes cover considerably more range of $V_{in}$. In FIG. 6B, 10 voltage units cover $A_{in}$ to 2.5 volts whereas in FIG. 6A one unit is about one-half full scale. The codes near the top (fs) of FIG. 6B are wasted because the gamma curve is rolled off. Again, the number of codes in FIG. 6A are equal to the same number of codes in FIG. 6B. In FIG. 6A the codes are compressed into a smaller area.

Figures 7A, 7B:
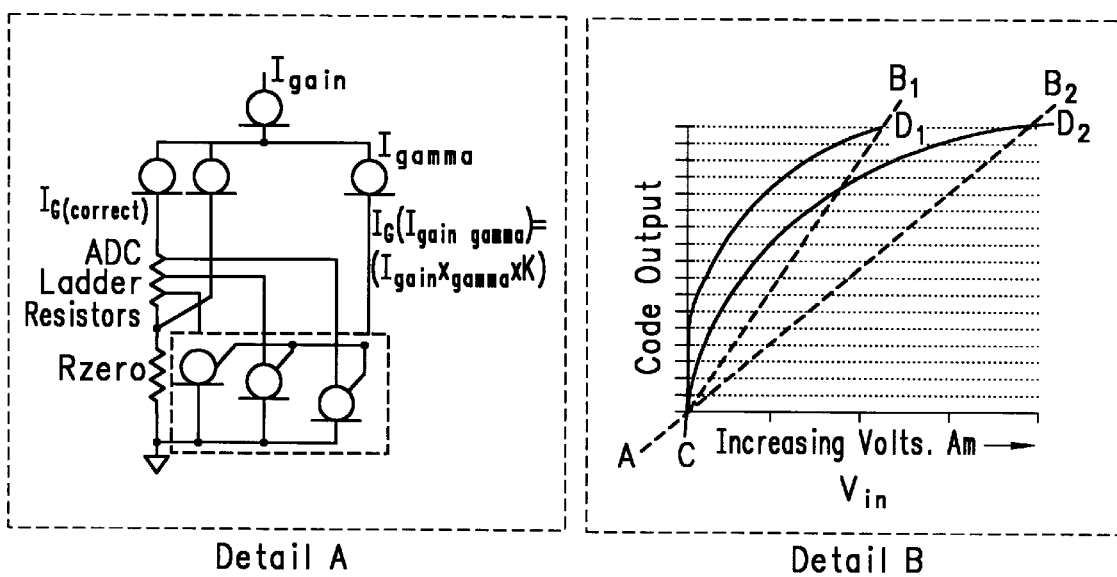
FIG. 7A is a schematic of a portion of a DAC in accordance with the invention.
FIG. 7B illustrates gain/gamma correction in the circuit of FIG. 7A.

Referring now to FIG. 7A, an embodiment of the invention is illustrated which shows a functional overview of how gain and gamma can be combined to produce a corrected subset of current sources, as illustrated in the plot of FIG. 7B. Span and gain are terms that relatively mean the same thing in an analog to digital converter. Span actually refers to the range of the analog input signal ($A_{in}$), while gain is the inverse of span. Gain can be thought of as a zooming in process, if gain is increased (zoom in on $A_{in}$) more $A_{in}$ detail is obtained but the span (range) is smaller.

For example, in a video ADC used to digitize a CCD output, each pixel requires full scale and black level correction on a pixel-by-pixel basis. This pixel-by-pixel correction is necessary because individual CCD outputs contain considerable error. Thus, the CCD must be calibrated before being put to use, and during calibration individual CCD elements are characterized and a table is built for the characteristics of each element. During use, the calibration information is used to set the ADC gain on a pixel-by-pixel basis in order to normalize the digitized CCD outputs.

The circuit of FIG. 7A includes circuitry to keep gamma and span curves in alignment where span is a variable. First, a constant current source, $I_{gain}$ is created. The $I_{gain}$ current source is split into corrected subcurrents for the ladder top and the gamma current mirror. If the gamma current leg currents are equal, the current supplied to the top of the ladder and the control current to the gamma mirror are equal. FIG. 7B shows how the gamma curve will track with a given change in gain (span). The point D1 of line CD1 connects with the full scale point of line AB1. Likewise, point D2 of line CD2 tracks line AB2. This represents two gain selections with an accompanied correction to the gamma curve under ideal design conditions. $I_{gain}$ to the top of the ladder has been corrected for the current taken out of the ladder by the gamma mirror. The gamma mirror control current has also been corrected for any change in gain (span) as the two current sources come from a common current source, $I_{gain}$.

Figure 8:
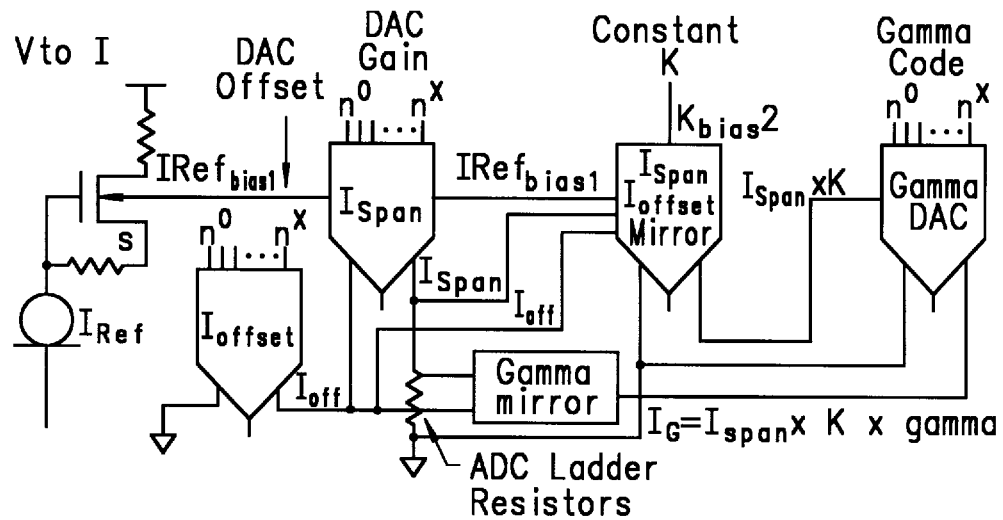
FIG. 8 is a schematic of a portion of an ADC in accordance with another embodiment of the invention.

The gain and gamma current correction can be obtained in a number of ways. One of these uses two DACs and an I-Span current mirror as illustrated in the embodiment of FIG. 8. The first DAC is the normal I-Span DAC connected to the top of the ADC ladder. This DAC combines the current reference with the externally specified span (gain). The second DAC mirror simply mimics the first DAC to combine a third term, identified as K. K is a constant that will set a defined ratio between the final currents of $I_{gain}$ and $I_{gamma}$. A single output of the I-Span mirror containing both span and the constant K is fed to a third DAC as a bias voltage (reference). In the third DAC, the gamma correction code is combined with a span and constant K.

Figure 9:
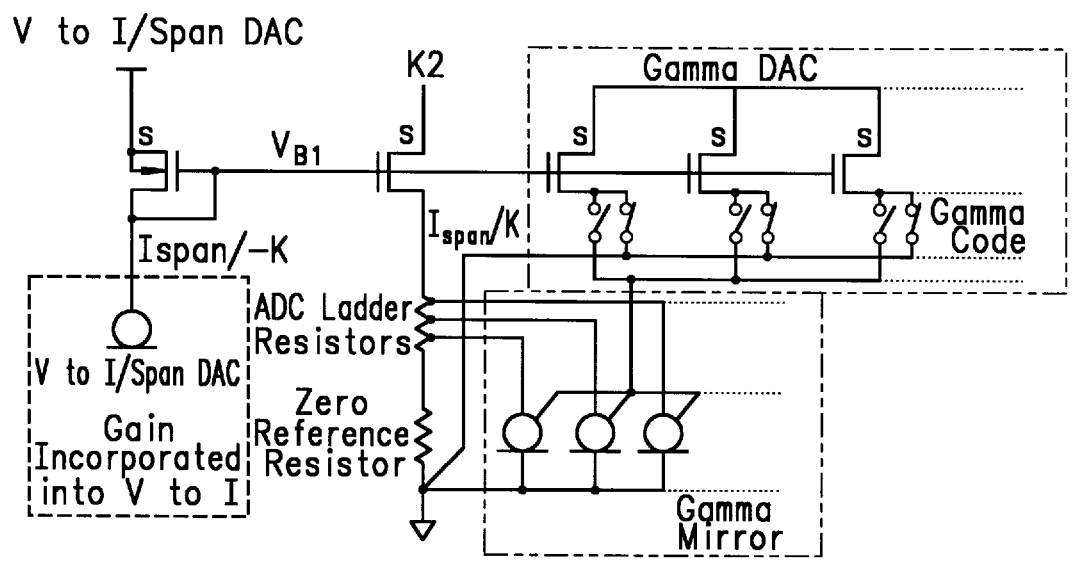
FIG. 9 is a schematic of a portion of an ADC in accordance with another embodiment of the invention.

A more efficient circuit which obviates the need for two DACs is illustrated in FIG. 9. This circuit incorporates the gain (span) into the voltage to current reference source (V to I). The current reference source no longer puts out a single current reference in accordance with the reference voltage, but rather the gain (span) also controls the V to I output reference. Control is in direct relation to the programmed gain. Thus, the voltage reference supplied externally provides the gain (span) for the ADC. In addition, an externally supplied control word modifies the current reference. The control word allows pixel-to-pixel gain (span) adjustment, while the voltage reference sets the overall gain requirement. Accordingly, by incorporating span (gain) into the V to I reference greatly simplifies circuitry requirements. The combining of the gamma code and the constant K2 is obtained simply by cascading current sources on the common V bias (Vb1) output. The V bias output is based on both the desired programmable span, and the fixed voltage reference. The gamma DAC elements can easily be expanded to n bits, simply by cascading additional stages onto the V bias output.

There has been described several embodiments of analog to digital converters having dynamically controlled non-linear outputs according to gamma correction curves. The circuitry provides hardware driven DAC analog output gamma correction, and both gamma and pixel-by-pixel correction capabilities can be incorporated in a single chip. While the invention has been described with reference to several embodiments, the description is illustrative of the invention and is not to be construed as limiting the invention. For example, the span and zero controls can be controlled by varying resistances of resistors or by other non-current means. The current mirrors can comprise P-channel enhancement mode transistors or bipolar transistors thus resulting in providing a positive and negative gamma correction. The converter can be a part of a larger system such as scanners, medical imaging, video signal capture, photographic image scanning, x-ray image scanning, digital camera systems, charge coupled device systems, probability density function optimized systems, area sensor arrays, line sensor arrays, and wireless systems. Various modifications and applications may occur to those skilled in the art without departing from the true spirit and scope of the invention as defined by the appended claims.

What is claimed is:

1. An analog to digital converter having a controlled non-linear output comprising
   a code converter,
   a resistor ladder connected between a zero reference voltage and a maximum span voltage for use in comparing an analog voltage and driving said code converter, said resistor ladder comprising a plurality of serially connected resistors with nodes between resistors,
   a first current driver means for selectively steering part of a first current through said resistor ladder and establishing said span voltage, and
   current sink means connected to said nodes for selectively adding or removing current from selected resistors and thus altering voltage drop across said selected resistors.

2. The analog to digital converter as defined by claim 1 and further including a zero reference resistor serially connected with said resistor ladder, and a second current driver means for selectively steering a part of a second current through said zero reference resistor for establishing a zero reference voltage for said span voltage.

3. The analog to digital converter as defined by claim 2 wherein said current sink means comprises a current sink.

4. The analog to digital converter as defined by claim 3 wherein said current sink comprises N-channel enhancement mode transistors.

5. The analog to digital converter as defined by claim 4 wherein said transistors receive a common bias voltage from a gamma digital to analog converter and driver which responds to a digital code for non-linearity control and for providing a gamma current to said current sink.

6. The analog to digital converter as defined by claim 5 wherein said first current driver means includes a current path through said zero reference resistor whereby a current is passed through said zero reference resistor equal to current removed by said current sink.

7. The analog to digital converter as defined by claim 3 wherein said current sink comprises P-channel enhancement mode transistors.

8. The analog digital converter as defined by claim 7 wherein said transistors receive a common bias voltage from a gamma digital to analog converter and driver which responds to a digital code for non-linearity control and for providing a gamma current to said current sink.

9. The analog to digital converter as defined by claim 8 wherein said first current driver means includes a current path through said zero reference resistor whereby a current is passed through said zero reference resistor equal to current removed by said current sink.

10. The analog to digital converter as defined by claim 3 wherein said current sink comprises bipolar transistors.

11. The analog to digital converter as defined by claim 3 wherein digital to analog converter responds to changes in span whereby current to said current sink is adjusted for changes in span current.

12. The analog to digital converter as defined by claim 11 wherein said gamma digital to analog converter and driver responds to said digital code and to a reference voltage which is a function of said first current driver means and a fixed ratio of span current to gamma current.

13. The analog to digital converter as defined by claim 1 and further including the following stages which incorporate analog interpolation via active averaging.

14. The analog to digital converter as defined by claim 1 and further including following stages which incorporate analog interpolation via passive means.

15. The analog to digital converter as defined by claim 14 wherein said passive means is selected from the group consisting of capacitive means and resistive means.

16. The analog to digital converter as defined by claim 1 wherein said converter comprises a part of a system selected from the group consisting of scanners, medical imaging, video signal capture, digital cameras, charge coupled device, probability density function optimized, area sensor arrays, line sensor arrays, and wireless receivers.

17. The analog to digital converter as defined by claim 1 wherein said first current driver means includes a current path through said zero reference resistor whereby a current is passed through said zero reference resistor equal to current removed by said current sink.

18. The analog to digital converter as defined by claim 17 wherein said gamma digital to analog converter and driver responds to said digital code and to a reference voltage which is a function of said first current driver means and a fixed ratio of span current to gamma current.

19. The analog to digital converter as defined by claim 1 wherein digital to analog converter responds to changes in span whereby current to said current sink is adjusted for changes in span current.

20. An analog to digital converter having a controlled nonlinear output comprising a code converter, a resistor ladder connected between a zero reference voltage and a maximum span voltage for use in comparing an analog voltage and driving said code converter, said resistor ladder comprising a plurality of serially connected resistors with nodes between resistors, a first current driver means for selectively steering part of a first current through said resistor ladder and establishing said span voltage, and means for selectively varying voltage at each of said nodes to provide a nonlinear range of voltages at said nodes between said zero reference and said maximum span voltage.

* * * * *